United States Patent
D'Souza

(10) Patent No.: US 6,587,746 B1
(45) Date of Patent: Jul. 1, 2003

(54) PROCESS AND APPARATUS FOR FACILITATING AUTOMATIC PRODUCTION OF DRAWING USING A CAD SYSTEM

(76) Inventor: Melanius D'Souza, 1718 Avenida Entrada, San Dimas, CA (US) 91773-4314

( * ) Notice: Subject to any disclaimer, the term of this patent is extended or adjusted under 35 U.S.C. 154(b) by 706 days.

(21) Appl. No.: 08/984,234

(22) Filed: Dec. 3, 1997

Related U.S. Application Data

(60) Provisional application No. 60/032,342, filed on Dec. 4, 1996.

(51) Int. Cl.[7] .............................................. G06F 19/00
(52) U.S. Cl. ...................................................... 700/182
(58) Field of Search ................................ 700/104, 103, 700/49, 182, 86, 108, 97, 98, 99, 71; 707/502; 702/81, 84

(56) References Cited

U.S. PATENT DOCUMENTS

| | | | | |
|---|---|---|---|---|
| 4,885,694 A | * | 12/1989 | Pray et al. .................... | 705/400 |
| 5,257,363 A | * | 10/1993 | Shapiro et al. ............. | 395/500 |
| 5,272,642 A | * | 12/1993 | Suzuki ........................ | 700/182 |
| 5,303,144 A | * | 4/1994 | Kawashima et al. ........... | 705/8 |
| 5,448,740 A | | 9/1995 | Kiri et al. .................... | 395/700 |
| 5,528,735 A | * | 6/1996 | Strasnick et al. ........... | 345/427 |
| 5,555,354 A | * | 9/1996 | Strasnick et al. ........... | 345/427 |
| 5,627,949 A | * | 5/1997 | Letcher, Jr. ................. | 345/420 |
| 5,671,381 A | * | 9/1997 | Strasnick et al. ........... | 345/355 |
| 5,701,400 A | * | 12/1997 | Amado ........................ | 706/45 |
| 5,726,914 A | * | 3/1998 | Janovski et al. ............... | 702/84 |
| 5,784,275 A | * | 7/1998 | Sojoodi et al. ................ | 700/86 |
| 5,812,394 A | * | 9/1998 | Lewis et al. ................... | 700/17 |
| 5,835,910 A | * | 11/1998 | Kavanagh et al. ........... | 707/103 |
| 5,861,885 A | * | 1/1999 | Strasnick et al. ........... | 345/355 |
| 5,917,730 A | * | 6/1999 | Rittie et al. ............. | 395/500.27 |
| 5,923,573 A | * | 7/1999 | Hatanaka ............... | 395/500.23 |
| 5,929,856 A | * | 7/1999 | Lo Negro et al. .......... | 345/349 |
| 5,946,212 A | * | 8/1999 | Bermon et al. ............... | 700/97 |
| 5,978,804 A | * | 11/1999 | Dietzman .................... | 707/10 |
| 5,991,528 A | * | 11/1999 | Taylor et al. ................. | 700/95 |

OTHER PUBLICATIONS

Cadra 111. User's Guide—Chapter 10 pp. 10–2 to 10–40.

* cited by examiner

Primary Examiner—John Follansbee
(74) Attorney, Agent, or Firm—Melanius D'Souza

(57) ABSTRACT

A code generation program, referred to as a parent program, for the creation of a child program for generating CAD script commands for automatically creating drawings in a CAD program. The parent program accepts descriptive information of the properties of various drawing entities and combines this information with computer statement templates to create functional computer statements, which calculates the values of the properties of the drawing entity. The parent program outputs these functional computer statements to the child program. The parent program also contains CAD script command templates and code to combine these templates with the calculated values of the properties of the drawing entity to create a functional CAD script command. The parent program also outputs the CAD script command templates and the CAD script combiner code to the child program.

22 Claims, 6 Drawing Sheets

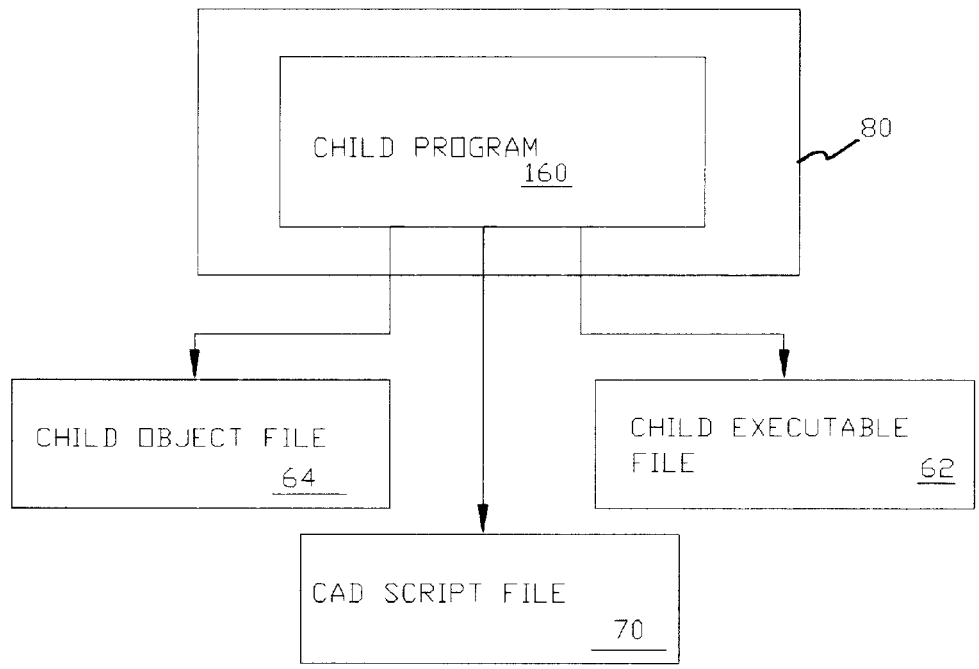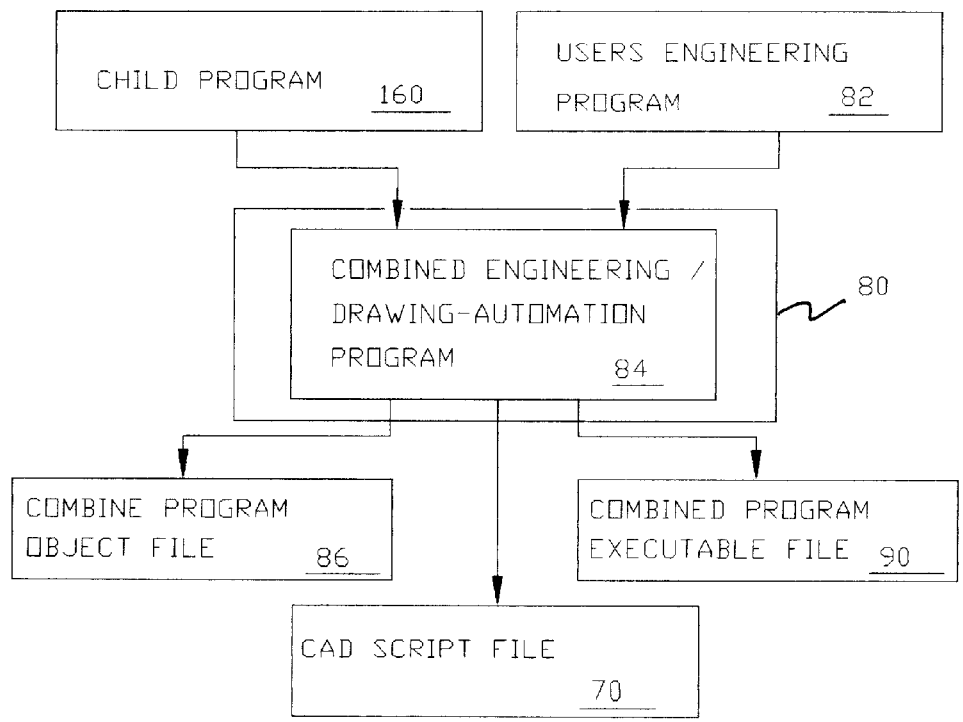

- Variable Initiation Options
  - ○ Define as Constant Value or Formula — 255
  - ○ Define as Input Statement — 260

Variable Name [    ] — 265
Variable Value [    ] — 270

Done — 280

FIG. 7 — 250

Line Type
  ○ New Line
  ○ Continuation

The values of the coordinates can be input as absolute values or as incremental values (using the + and - signs) or as formulae.

|  | 310X x-coordinate value 310A | 310Y y-coordinate value 310B |
| --- | --- | --- |
| Start Point | [ ] [        ] | [ ] [        ] |
| End Point | [ ] [        ] | [ ] [        ] |
|  | 320X  320A | 320Y  320B |

Done — 330

FIG. 8 — 300

- Options
  - ○ Arc          ○ Create Variable      ○ Create Block
  - ○ Circle                              ○ Insert Block
  - ○ Line                                ○ Minsert Block
  - ○ Double Line
  - ○ Poly-Line
  - ○ Rectangle

405 click here when done — 410

FIG. 9 — 400

PROCESS AND APPARATUS FOR FACILITATING AUTOMATIC PRODUCTION OF DRAWING USING A CAD SYSTEM

BACKGROUND—CROSS-REFERENCE TO RELATED APPLICATIONS

This is a regular (non-provisional) patent application which claims priority from the provisional patent application No. 60/032,342 filed on Dec. 4, 1996.

BACKGROUND—FIELD OF THE INVENTION

The invention described herein generally relates to a process and apparatus for facilitating the easy and automatic production of drawings. More particularly it relates to the automation of drawings using a Computer Aided Design (CAD) system by persons having a very low level of computer programming skills.

BACKGROUND—DISCUSSION OF PRIOR ART

Automation of the production of engineering drawings is a goal which is sought by many companies. This is specifically true of companies which are involved in the design and production of customized process equipment. In such cases, it is very difficult to create a set of standard drawings which can be easily modified for issue for fabrication. Currently, the only way for a company to automate its drawings is through the creation of customized computer programs written by skilled computer programmers. However, most manufacturing companies, especially small ones which make up a significant portion of the national economy, lack the programming expertise to create these programs in-house. These programs are generally very tedious and time consuming to write. Use of outside computer programming consultants for this purpose is expensive. These outside programmers may also not fully understand the business of the company to create a customized computer program which adequately meets the needs of the company. Thus mistakes in the computer program may be made which may prove costly to the company in terms of improper design of the equipment and consequent re-work and customer dis-satisfaction. The evolving nature of business and competition also engenders almost continuous changes in the design of the equipment. These changes in equipment design are also difficult to incorporate into the customized computer program which often times may need very extensive, expensive, and time consuming modifications to incorporate the changes made in the design of the equipment into the computer program. In most cases, it is also very difficult for the average user to integrate such customized programs into the company's equipment design program which is generally developed in-house through much trial and error.

A typical example would be a company which is involved in the design and manufacture of air-scrubbers. Such companies are typically small. They generally have an equipment sizing program which is based upon mass-transfer principles. This program would give the diameter and height of the scrubber tower to be used to meet a given scrubbing application. These parameters now have to be transformed into a mechanical design which has then to be made into fabrication drawings for the manufacture of the scrubber. The mechanical design may be carried out by hand or by another or the same computer program to give more details of the thickness of the shell and dimensions of other appurtenances which make up the complete scrubber system. These details then have to be drawn up using a CAD system to create the fabrication drawings for the manufacture of the scrubber. Generally this is done by manually modifying a drawing of a previous application with the new dimensions. A great increase in productivity could be achieved for such a company if the process design, the mechanical design, and the CAD programs could all be integrated so that a user could not only do the process design but at the same time, generate all the mechanical details and create a CAD drawing for the application. This would also enable the engineer to more accurately estimate the cost of the equipment for sales-proposal and budgetary purposes. Therefore it would be advantageous to have a means for the average small manufacturing company's engineers and draftsmen to be able to create, maintain, and modify their own customized computer program for the automatic generation of drawings.

Currently many CAD packages offer several methods to automate drawings. One of the best known is the AutoLISP (R) language which is a part of the popular AutoCAD (R) program sold by Autodesk, Inc. of Sausalito, Calif. However, the disadvantage of the AutoLISP (R) language is that it is complicated for the average user to learn and use because it has its own specialized syntax which is unlike the regular English language. Programs written in the AutoLISP (R) language also work totally within the AutoCAD (R) environment. It is also difficult for the average user to combine the AutoLISP (R) code with code written in other languages like BASIC(R), QuickBASIC(R), VisualBASIC (R), C++ (R), FORTRAN (R), etc. Such a combination requires programming skills which are beyond the capability of the average user. Because of these considerations, programmers who are expert in the AutoLISP (R) language are also too expensive to be hired by the average small manufacturing company.

Another popular CAD program is the MicroStation (R) program sold by Bentley Systems, Inc. of Huntsville, Ala. This program uses a version of the popular BASIC (R) language to automate drawings. While not as complicated as the AutoLISP (R) language, it is still a distinct dialect of the BASIC (R) language. Therefore, it still has the disadvantage that it needs to be learnt to be used and then used on a regular basis for a person to be familiar with it. It also runs totally within the MicroStation environment and cannot be easily integrated, by the average user, with other engineering design programs.

Another way for a user to automate drawings within the AutoCAD(R) environment is to use the AutoCAD(R) script system which is provided as a means for creating slide shows of AutoCAD(R) drawings. The AutoCAD(R) script system is very easy for the average user to comprehend and use because it uses English-like commands to generate drawing entities. However, the disadvantage of the AutoCAD(R) script system is that there is no flexibility in varying the dimensions of the drawing entity automatically; once a drawing is defined using the AutoCAD(R) script system, the relationships between the dimensions remain fixed as shown in the drawing. All coordinate-points in the AutoCAD script commands are defined as numbers; they cannot be defined as user-defined and run-time variables as is possible in the AutoLISP (R) and MicroStation (R) environments. Since there is no way to provide variables or mathematical and boolean relationships between the coordinates of the points on the drawing, a change in one point does not automatically make a corresponding change in the other dimensions. Thus the AutoCAD(R) script system cannot be used to create a general mathematical model of the equipment which can be easily modified to depict a specific embodiment of the equipment. Such modifications would involve extensive and time consuming changes to the AutoCAD(R) script command file and are therefore not practical. The AutoCAD(R) script system also works totally within the AutoCAD (R) environment and cannot be easily integrated with the user's design programs.

Other third party programs have been commercialized to make the automation of drawings easier. An example is the AutoBASIC (R) system sold by BitWise Solutions Inc. of Indianapolis, Ind. The AutoBASIC (R) programming language is a hybrid language modeled after QBASIC (R) and combined with the functions and commands familiar to AutoCAD (R) Development System and AutoLISP programmers. However, it too suffers from the disadvantage that it has to be learned and used on a regular basis for the user to become familiar with it. It also works totally from within the AutoCAD environment and cannot be easily integrated into other engineering design programs.

Another example of a drawing automation system is the CADRA-III FLEXDESIGN (R) system sold as part of the CADRA (R) package by ADRA Inc. of Lowell, Mass. The CADRA-III FLEXDESIGN (R) system is described as a graphical spreadsheet and is easy to use because it does not need any programming skills as required in the AutoLISP (R) system. It is also more flexible than the AutoCAD (R) script system because the user can change one of the dimensions on a drawing on the screen and the FLEXDESIGN (R) program will automatically make the corresponding mathematically defined changes in the other dimensions. However, the FLEXDESIGN(R) system works only within the CADRA-III (R) system which is a very specialized operating system unlike systems which operate under the DOS operating system. It also does not create a usable program which can be easily integrated into the user's engineering program. A full description of the CADRA FLEXDESIGN (R) system is given in chapter 10 of the CADRA-III (R), version 9 user's guide.

All of the above approaches require a specialized approach to automating drawings which need intense study and application for proficiency. It is the object of this invention to allow the average user to automatically create his/her drawing using only his basic knowledge of coordinate geometry and a rudimentary knowledge of programming. This object is achieved by creating a code generation program which automatically transforms the generalized mathematical equations which represent the drawing entities on a drawing into computer code which, when executed, will create customized CAD script commands which uniquely defines the drawing to the CAD program.

Code generation programs have long been known and have been used for various applications. However, their use for the creation of customized programs to create CAD script files in not known. An example of an application is described in U.S. Pat. No. 5,448,740 to Kiri (1995). The Kiri code-generation system uses similar concepts of generating a code automatically as described in the present invention. However, it is not applied to generating a code for CAD applications. It is used for the generation of specific interface code to produce an user interface between an user and an application program.

OBJECTS AND ADVANTAGES

Accordingly it is the object of the present invention to create a computer software program (referred to herein as a "parent" program) and process which will easily and automatically generate an application-specific generalized computer program (referred to herein as a "child" program) which has the capability of easily and automatically creating a customized script for the generation of CAD drawings of an specific embodiment of the application. The customized child program created by the parent program is general enough so that the user can easily change the run-time variables which define the specific embodiment of the application. The child program will then automatically change the other variables according to mathematically defined relationships between the coordinates of the drawing entities which make up the drawing and automatically generate a customized CAD script file which when run in the CAD program will generate the required customized drawing of the specific embodiment of the application. For example, the user can easily create a generalized computer language program which mathematical defines a scrubber system but the generalized program will also be capable of accepting run-time variables like scrubber diameter and height. Thus the user can easily create a customized drawing that represents the particular scrubber system that he/she is designing. The user will need minimum programming skills to create the child program. Furthermore, he/she will be able to integrate the child program with other child programs created by other users to create a comprehensive program to design an entire application. He/she will also be able to easily integrate his child program with other engineering design programs to create an integrated approach to designing, estimating, and fabricating his equipment. Finally, he/she will be able to do so using only a minimum knowledge of computer programming and without having to hire expensive external computer consultants and programmers for the purpose.

SUMMARY OF THE INVENTION

These and other objects are achieved by the present invention which preserves the advantages of using the AutoCAD (R) script system while also incorporating the flexibility of the AutoLISP (R) or CADRA FLEXDESIGN (R) programs.

The above objects are achieved by a method for creating a parent program which, when executed and when input with descriptive information pertaining to the drawing entities, automatically generates a child program which describes a general embodiment of the application. This child program, when executed and when input with run-time variables, creates a customized script which describes a specific embodiment of the application.

The parent program is created by providing the following computer code:

(a) computer code for generating a menu of drawing entities and computer code to select a drawing entity from the generated menu of drawing entities, (b) run-time services computer code, for example, for opening and closing a CAD script file, and computer code to output this CAD script file manipulation code to the child program file, (c) computer code to enable the parent program to accept descriptive information of the properties, for example, the x,y coordinates or the diameter, of the selected drawing entity. This information can be input either as numerical values of the properties of the drawing entity or as general mathematical equations interrelating the properties of the drawing entity with those of other drawing entities and special variables. The descriptive information also includes code to input run-time variables which can be input when the child program is executed to define unique aspects of the application, (d) computer code to convert the above descriptive information into computer code fragments,
(e) templates of computer language statements,
(f) computer code to insert the above computer code fragments into the above templates of computer language statements. This insertion process creates functional computer statements for calculating the values of the properties of the selected drawing entity from the mathematical description of the properties which were input in (c),
(g) computer code to output the functional computer statements created in (f) to the child program,
(h) templates of CAD script commands for various drawing entities,
(I) computer code to combine the values of the properties of the drawing entity, that are calculated by the above functional computer statements, with the template of the CAD script command for that entity so that a functional CAD script command is created,
(j) computer statements to output the created functional CAD script command to a CAD script file, and
(k) computer code to output the CAD script templates in (h), the combiner code in
(I), and CAD script output-to-CAD script file statements in (j) to the child program.

When the parent program is executed, it first outputs the run-time service statements in (b) above to the child program file. The parent program then requests the user to select a drawing entity from the menu of drawing entities created by statements in (a) above. When the user selects a drawing entity, the parent program requests descriptive information, as described above, which defines the properties of the drawing entities. The parent program then combines this information with the computer language statement templates in (e) above for the selected drawing entity to create functional computer statements that describe the selected drawing entity. These functional statements are then outputted to the child program file. The parent program then requests the user to select another drawing entity. As successive drawing entities are selected, the child program file is built up with the additional functional computer statements which describe each successive drawing entity. When all the drawing entities have been selected, the parent program outputs the CAD script templates, the CAD script combiner code, and the CAD script command output statements to the child program.

Thus the child program which is generated by the operation of the parent program contains computer statements to open a CAD script file, computer statements to input run-time variables, computer statements to calculate the values of the properties of the drawing entity from the values of the properties of other drawing entities and special variables, computer statements to combine the values of the properties of the drawing entity with the CAD script command template to create a functional CAD command, and computer statements to output the CAD script commands to a CAD script command file.

When the child program is executed by the user, it requests the user for the values of any run-time variables that may be required to describe the specific embodiment of the application being drawn. When the user inputs these run-time variables, the child program calculates the values of the properties of each of the drawing entity that was selected during the execution of the child program. It then combines these values with the CAD script command template to create a functional CAD script command which it then outputs to the CAD script command file. Thus a sequence of CAD script commands, which describe all the drawing entities which make up the specific embodiment of the application, is written to the CAD script command file. When the CAD script command file is processed by the CAD program, the CAD program automatically generates the drawing of the specific embodiment of the application.

This brief summary was provided so that the nature of the invention may be understood quickly. A more complete understanding of the invention can be obtained by reference to the following detailed description of the preferred embodiment thereof in connection with the attached drawing.

BRIEF DESCRIPTION OF THE DRAWINGS

FIG. 4 is an overview of the child program during run-time.

FIG. 5 is a second alternate overview of the child program during run-time.

FIG. 7 is a representation of an input screen for defining a variable.

FIG. 8 is a representation of an input screen for defining a line.

FIG. 9 is a representation of the drawing entity selection screen.

REFERENCE NUMERALS IN DRAWINGS

Figure 1:
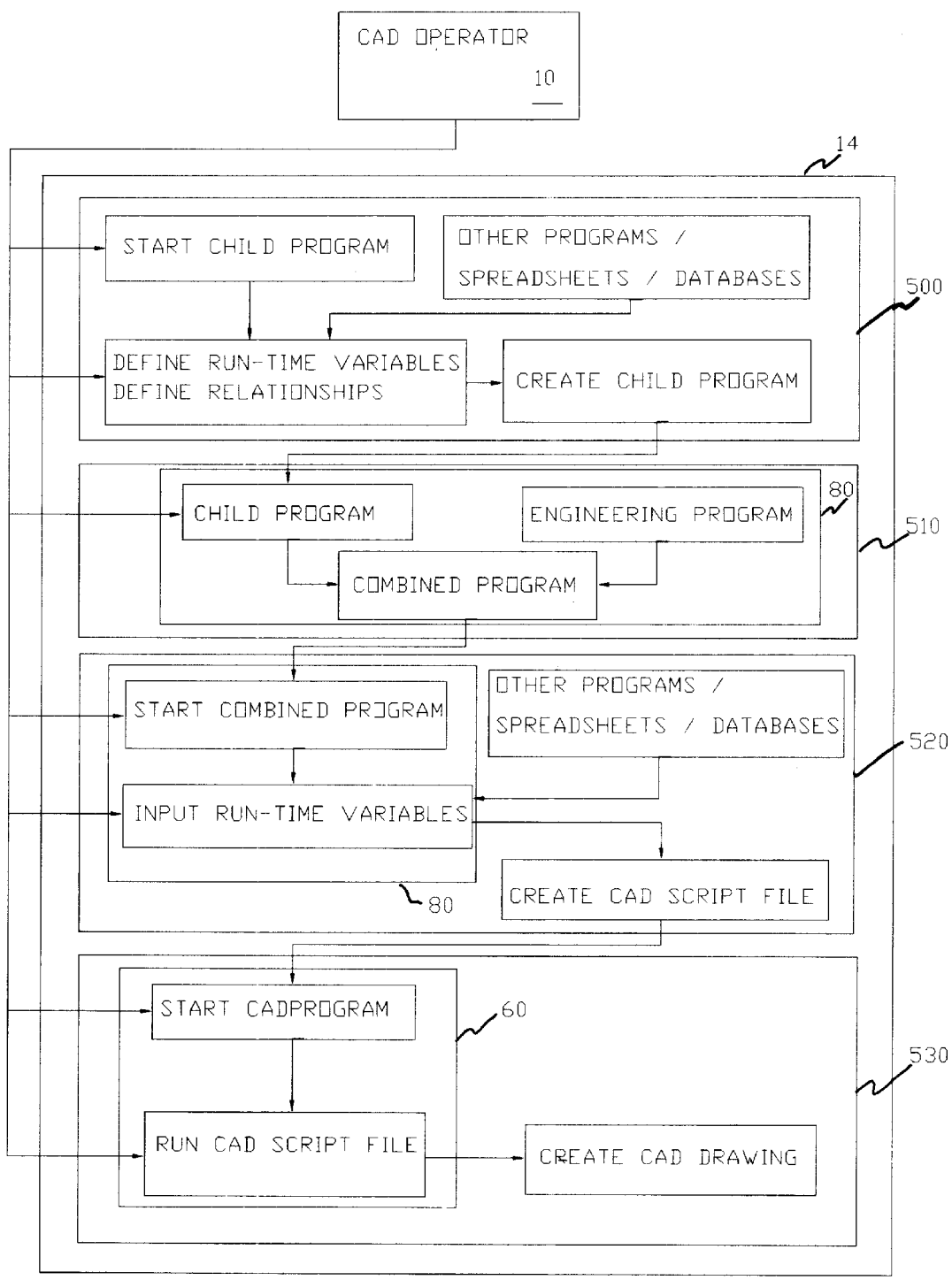
FIG. 1 is a overview of the steps required to automatically generate a drawing using the present invention.

| | |
|---|---|
| 10 | computer operator |
| 14 | computer environment |
| 60 | CAD program |
| 62 | child executable program file |
| 64 | child program object file |
| 70 | CAD script file |
| 80 | code compiler environment |
| 82 | user's application program |
| 84 | combined application program |
| 86 | combined program object file |
| 90 | combined executable program file |
| 92 | DOS environment |
| 100 | parent program |
| 105 | computer language template code block section |
| 110 | computer language template code block in 105 for drawing entity "X" |
| 112 | input statement template code block in 110 |
| 115 | assignment statement template code block in 110 |
| 120 | procedure invocation template statement code block in 110 |
| 125 | code combiner block in 110 |
| 130 | code block to print functional computer code to child program file 160 |
| 135 | drawing entity selection code block in parent program 100 |
| 140 | drawing entity description input code block in parent program 100 |
| 145 | code block in 100 to generate code for run-time services |
| 148 | script file open-close statement code block in 145 |
| 150 | memory allocation statement code block in 145 |
| 155 | code block in 145 to print code in 148 and 150 to child program file 160 |
| 160 | child program |
| 165 | run-time service statements generated by 155 |
| 170 | run-time variable input computer language |

-continued

| | statements generated by 130 |
|---|---|
| 172 | Assignment statements generated by 130 |
| 174 | CAD script creation procedure invocation statements generated by 130 |
| 176 | CAD script creation procedures generated by 205 |
| 178 | procedure sub-block for drawing entity "X" in 176 |
| 180 | CAD script templates code block section |
| 185 | CAD script template code sub-block in 180 for drawing entity "X" |
| 190 | CAD script template in 185 |
| 195 | code combiner block in 185 |
| 200 | code to print CAD script command text to CAD script file 70, in 185 |
| 205 | code to print 190, 195, and 200 to child program file 160. |
| 210 | run-time variables |
| 250 | special variable definition form |
| 255 | special variable definition as equation option button |
| 260 | special variable definition as input option button |
| 265 | special variable name input box |
| 270 | special variable value input box |
| 280 | special variable definition accept command button |
| 300 | straight line 310 definition form |
| 310X | variable name for x-coordinate of starting point of straight line |
| 310Y | variable name for y-coordinate of starting point of straight line |
| 310A | variable value for 310X |
| 310B | variable value for 310Y |
| 320X | variable name for x-coordinate of ending point of straight line |
| 320Y | variable name for y-coordinate of ending point of straight line |
| 320A | variable value for 320X |
| 320B | variable value for 320Y |
| 330 | accept variable definition command button |
| 400 | drawing entity selection form |
| 405 | drawing entity option radio-buttons |
| 410 | terminate drawing entity selection command button |
| 500 | operation of parent program 100 |
| 510 | post-processing of child program 160 |
| 520 | operation of child program 160 |
| 530 | operation of CAD program 60 |

DETAILED DESCRIPTION OF THE PREFERRED EMBODIMENT

Figure 2:
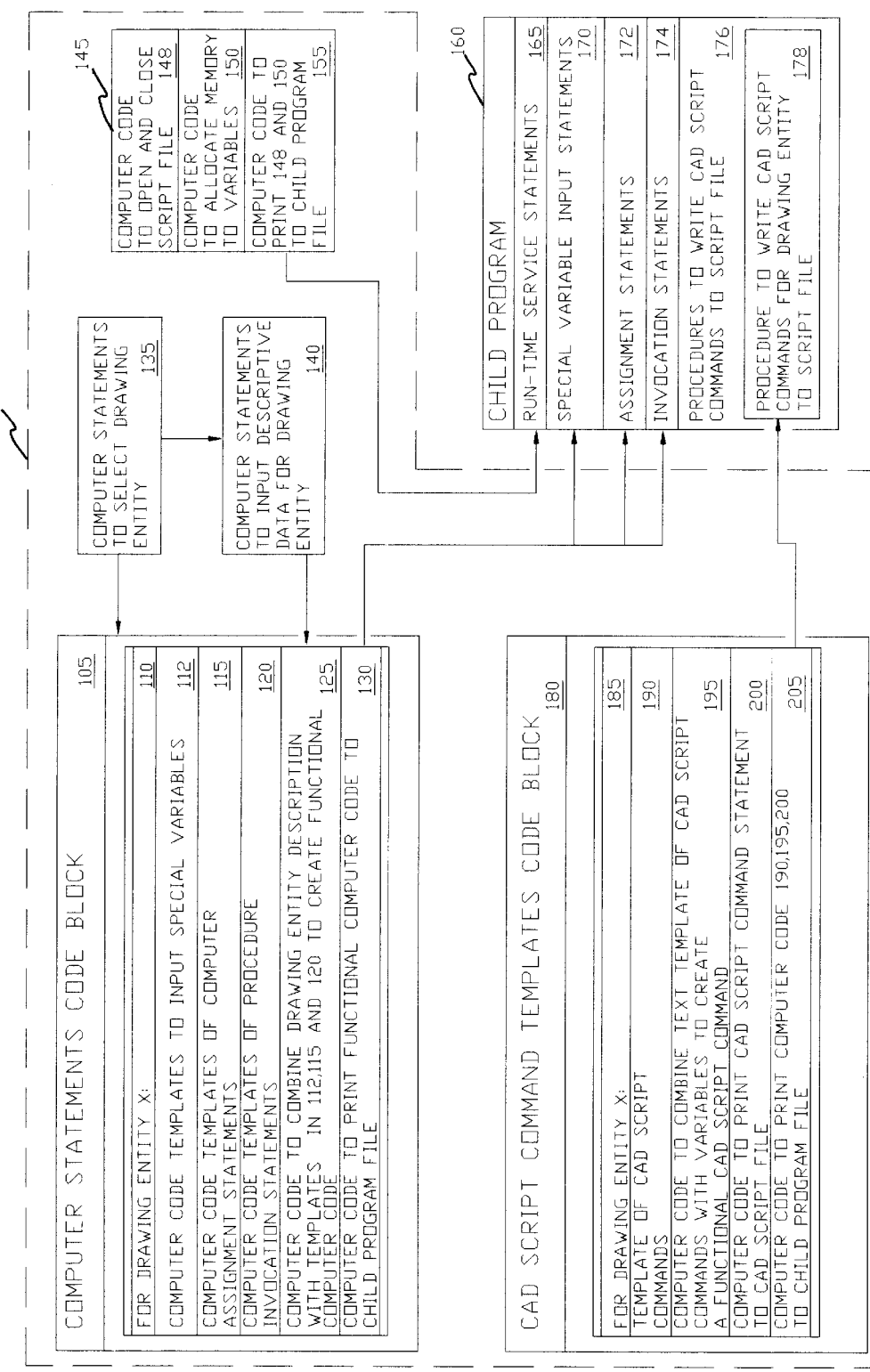
FIG. 2 is an overview of the parent program.

The invention is best understood with reference to FIGS. 1 to 9. FIG. 2 shows an overview of the structure of the code generation or parent program 100. The parent program 100 contains a first code block 145 which generates code for run-time services in the child program 160. Run-time services are defined as functions required for the operation of a computer program such as allocation of memory to variables, declaration of procedures, and opening and closing of input and output files. The code block 145 contains computer code 148 to open and close a CAD script file 70. If the AutoCAD(R) program is used, the CAD script file is given the extension .SCR; if other CAD programs are used, the rules for naming the script file for that program should be followed. The code block 145 can also contain computer code 150 to allocate memory to variables used in the child program 160. It may also contain statements to declare procedures, however, these statements may not be necessary if the code compiler used for processing the child program 160 automatically generates such code. The QBASIC (R) compiler has this capability. So if the child program 160 is created in the QBASIC (R) language, the declaration statements do not have to be generated by the parent program 100 because they will be automatically generated by the compiler. Finally code block 145 also contains computer code 155 which generates the child program 160 by printing out the computer code in blocks 148 and 150 to the child program file 160. After the completion of this stage of the code generation process, the child program 160 contains, as a minimum, computer statements which open and close a CAD script file 70 for output of the CAD script commands from the child program 160. Other statements for allocation of memory and declaration of procedures may also be generated if required by the compiler used to process the child program 160. Additional statements may also be included in code block 145 to create computer statements in the child program 160 to allow the user to input a name for the CAD script file 70 during the execution of the child program 160. All of these generated statements carry out the run-time services for the child program 160.

A second code block 180 in the parent program 100 contains computer code for the generation of CAD script commands for various drawing entities. Computer code specific to each drawing entity is contained in sub-blocks; a typical sub-block 185 is shown for drawing entity "X". Various computer statements for creating a drawing entity "X" are contained in the sub-block 185. In CAD terminology, an entity denotes a line, circle, arc, rectangle, text, or other figure that can be created using a CAD command. Computer code 190 in sub-block 185 contains a template for the CAD script command to draw the drawing entity "X". The concept of a template is illustrated by the following example. If the drawing entity "X" is a straight line, the AutoCAD (R) script command to draw a line from a starting point having x,y coordinates equal to 12,17 to an end-point having x,y coordinates equal to 23,45 is "line 12,17 23,45". To create this command, sub-block 190 contains a script command template in the form of a computer code string "line^^^,^^^^^, ^^," where ^ denotes a blank space. Computer code can then be provided to fill the number 12 in the second and third blank spaces, the number 17 in the fourth and fifth blank spaces, the number 23 in the seventh and eighth blank spaces, and the number 45 in the ninth and tenth blank spaces. The first and fifth blank spaces are not filled because they are part of the syntax of the CAD script command to draw a straight line. Thus the AutoCAD (R) script command "line^2,17^23,45" is created. When this CAD script command is processed by the AutoCAD(R) program, it will draw a line from the starting point 12,17 to the end-point 23,45. The computer code to fill in the blanks in the template as illustrated above is contained in sub-block 195.

While the above example shows the template as a string variable, the CAD script command can also be built up by concatenating the script command fragments with the numbers describing the points on the drawing entity. Thus in the above example, the illustrated script command could be created by first concatenating the string "line^" with the number 12 to give a string "line^12". This string is then concatenated with the character "," to give a string "line ^12,". Further concatenation of this string with the number 17 results in the string "line^12,17". This string is then concatenated with a blank space character to give a string "line^12,17^". Further concatenation of this string with the number 23 gives the string "line^2,17^23". This string is then concatenated with the character "," to give a string "line^12,17^23,". Further concatenation of this string with the number 45 results in the string "line^12,17^23,45" which describes an AutoCAD(R) script command for drawing a straight line within AutoCAD(R). A carriage return character CHR$(10) is then appended to the end of this string to automatically execute the command after it is processed by the AutoCAD (R) program. This procedure has been followed in the sample computer code shown in Appendix A.

The sample code in Appendix A is written in VisualBASIC (R) but it could be written in any computer language. Since the child program 160 manipulates the coordinate values of the drawing entity as variables, the STR$ function is used to return a string representation of the number represented by the variable. The RTRIM$ and LTRIM$ functions are used to remove any blank spaces that lead or follow the string returned by the STR$ function so that only the digits of the number are extracted from the variables which describe the coordinates of the drawing entity. These digits are then filled in the blanks in the CAD script template. Thus if a previous assignment statement for the value of a x-coordinate of a point was "X1=12", then the computer code RTRIM$(LTRIM$(STR$(X1))) returns the string "12" which can then be concatenated into the template of the CAD script command as described above.

The CAD script command string that is generated by the above procedure can be assigned to a string variable which can then be printed to the CAD script file 70 as a string by using a print-to-file command in the child program 160. Alternately, the print-to-file command in the child program 160 can print the generated CAD script command string directly to the CAD script file 70 without it being first assigned to a string variable. The code for doing so is contained in the statement sub-block 200 in code block 185. In Appendix A, the CAD script command string is first assigned to a string variable called "cc$" which is then printed out to the CAD script file using the "PRINT #1, cc$" statement which is generated in the child program 160. The "PRINT #1, cc$" statement represents statement sub-block 200 in code block 185. Finally the sub-blocks 190, 195, and 200 themselves are all outputted to the child program file 160 by the sub-block 205. In Appendix A, this is done by the 'Print #1, "######"' statements at the beginning of each statement line, where # denotes the code created in sub-blocks 190, 195, and 200. By following this procedure, the child program file 160 is populated with the QBASIC(R) statements which were created in sub-blocks 190, 195, and 200 and which describe each drawing entity as CAD script commands.

For ease of programming, the QBASIC(R) statements shown in Appendix A are created in procedure form so that they can be repeatedly invoked from the child program 160. The procedure block is shown as block 176 in child program 160. The procedure sub-block for drawing entity "X" is shown as sub-block 178 in block 176. In the sample computer code, in Appendix A, for creating a CAD script for a straight line, a procedure named "line00" is created. This procedure contains all the computer statements in statement sub-blocks 190, 195, and 200 (which were contained in code block 185) for the drawing entity "X". While it is not necessary to create the QBASIC (R) statements in a procedure form, it facilitates the creation of a more concise child program 160 than if the procedure form were not used. The use of procedures also makes it easier to create and de-bug the child program 160. While the example in Appendix A shows the child program 160 created in the QBASIC(R) language, any computer language can be used to create it. Further, it is not necessary to create the computer statements making up the child program 160 in a text form as shown in Appendix A; they could very well be created in binary forms or hexadecimal forms or any other computer readable formats. QBASIC(R) was chosen in this example because it is universally known, is easy to learn and use and is readily available to the average user. The child program file 160 and CAD script files 70 can also be written directly to memory like in a RAM disk rather than to a fixed media as shown in Appendix A. The above example and detailed description of the method of creating a CAD script command for a straight line can be easily extended to the creation of procedures for any other drawing entity like an arc, circle, text, etc. for which a CAD script template as described above can be created.

The description so far shows how variables which describe coordinates and other dimensional quantities pertaining to drawing entities can be inserted into CAD script templates to create code that when executed creates CAD script commands. However, to create a child program 160 which is capable of generally describing a CAD drawing in terms of its drawing entities, the coordinates of the points which make up the drawing entities have to be provided to the parent program 100. Furthermore, the mathematical relations between these points also have to be provided so that the relative positions of the drawing entities can be accurately calculated and described on the drawing. Some of the dimensions may have to be input as variables which can be only be provided at run-time; hence code to request the user to input these variables has to be generated. These run-time variables have to be provided to the child program 160 while it is being run. Furthermore, relationships and quantities which affect the drawing entities also have to be expressed. These relationships and quantities have to be provided to the parent program 100 at the time of creating the child program. The code for inputting all of this information to the parent program 100 is contained in block 140 in FIG. 2. The code for processing these inputs so that computer code can be generated and included in the child program file 160 is contained in code block 105 in FIG. 2. The input block 140 will be described first followed by the description for code block 105.

The input block 140 is best described using FIGS. 7 and 8 as illustrations. FIG. 7 shows an input form 250 for creating a special variable in the child program 160. The creation of such input forms is well known to the average VisualBASIC (R) programmer. The input form 250 contains option button 260 for defining the special variable as a run-time input during the execution of the child program 160. These run-time variables are useful for creating variables which will customize the drawing. For example, if the drawing is for a square plate with a round hole in its center wherein the length of the side of the square and the diameter of the hole can vary independently, then the user can define two run-time variables while creating the child program. The first run-time variable could be called "LENGTH" and could define the length of the side of the square. The second run-time variable could be called "DIAMETER" and could denote the diameter of the hole in the square. As will be described later, the parent program 100 will then generate computer code in the child program 160 which requests input of the values of these run-time variables when the child program 160 is executed.

The input form 250 also contains option button 255 for defining the special variable as a constant numerical value or as an equation during the execution of the parent program 100. An example of the first situation is when there are two circles on a drawing. The first circle has a radius "RADIUS 1" and the second circle has a radius "RADIUS2". If it is required that RADIUS2 always be 25% greater than RADIUS1, then a special variable "RATIO" can be defined and assigned the constant value "1.25". Then the value of RADIUS2 can be defined by the equation "RADIUS1 * RATIO". An example of the second situation is when there are two circles inscribed within a third circle on a drawing. The first circle has a radius "RADIUS1" and the second circle has a radius "RADIUS2". Then the special variable named "RADIUS3" which describes the radius of the circumscribing circle can be created and defined by the equation "RADIUS1+RADIUS2". The name of the variables i.e. "RATIO" or "RADIUS3" to be used in the child program 160 is entered in input box 265 on the variable input form 250 while the value of the variable is input in box 270 either as a constant value i.e. "1.25" or as an equation i.e. "RADIUS 1+RADIUS2" as described above. Option buttons 255 and 260 are radio buttons; thus only one can be selected at a time. When option button 260 is selected, the input box 270 is disabled; hence the user can only input a name for the variable in box 265. Thus in the above example of a round hole in a square plate, the user will only be able to input the run-time variable names i.e, "LENGTH" and "DIAMETER" in input box 265 because input box 270 is disabled. As will be discussed below, the parent program then creates code for inputting a run-time variable in the child program 160. When option button 255 is selected, the variable name can be entered in input box 265 and the value of the variable can be entered in input box 270. Form 250 also has a command button 280 which when activated accepts the variable name and values that were input in boxes 265 and 270 and assigns them to variables in the parent program 100. As will be explained below, these variables will then be combined with computer code templates which are output to the child program 160 to create functional computer statements.

FIG. 8 shows another example of an input form. The input form 300 is used to input the "x" and "y" coordinates of the starting point and the end-points of a straight line. The x and y coordinates are automatically generated by the parent program 100 in input boxes 310X, 310Y, 320X, and 320Y and are named "XI","YI" where "I" is an index integer for the starting point and "XJ","YJ" where "J" equals "I+1" is an index integer for the end-point. As an alternative, the x and y coordinate variable names can also be input by the user, but it is well within the skills of an average computer programmer to write code to have the computer create them. The values of coordinates can be input by the user in input boxes 310A, 310B, 320A, and 320B. The values of the coordinate points can be input either as absolute values or as incremental values relative to the last point defined on the drawing or as an equation. A fixed point on a drawing would be defined as an absolute value. Thus giving the value 12 to the x-coordinate of a point and the value 22 to the y-coordinate of the same point would define a fixed point 12,22 on the drawing. If the value of the next point is defined as +5 for the x coordinate and −3 for the y-coordinate, then the next point has absolute coordinates of 17 (equals 12+5) for the x-coordinate and 19 ( equals 22−3) for the y-coordinate. Computer code can be provided in the parent program 100 to perform the mathematical operations to derive the coordinates of the second point from the coordinates of the first point. Alternately, the second point can be defined as an equation by the computer user. Hence, if "I" equals 8 in the above example, the user would input the equation "X8+5" to calculate the value of the x-coordinate, X9, of the second point from the value of the x-coordinate of the first point. Similarly the user would input the equation "Y8−3" to calculate the value of the y-coordinate, Y9, of the second point from the value of the y-coordinate of the first point. Similar input forms are used for inputting the coordinate values of other drawing entities like arcs, circles, etc. The values of the coordinates in these forms is input in the same manner as described above for the straight line. The mathematical equations inter-relating the coordinates can include all the arithmetic operators as well as any special functions which are part of the computer language's library of standard functions. Thus for a child program which is generated in QBASIC (R), the equations can include transcendental functions like SIN, COS, and LOG to describe the coordinate and special variables in forms 250 and 300. The values of the coordinates which were entered in input boxes 310A, 310B, 320A, and 320B in form 300, are assigned to variables by the parent program 100 and, as will be discussed below, are converted by block 105 into computer code for output to the child program 160. The "Done" command button 330 in form 300 is activated to accept the inputted variable names and values.

While the above description shows that the computer user 10 manually inputs the description of the drawing entity, the variable names and values describing the drawing entity could well be imported from another computer program like a spreadsheet or a computer data-base. For example, the properties of the drawing entity could be resident in a computer database. The parent program could then extract the data from the database and input it automatically into the input block 140.

The variable names and values, input in input block 140 as described above with respect to FIGS. 7 and 8, are used by code block 105 in FIG. 2 to generate the computer code that makes up the child program 160. Code block 105 consists of sub-blocks 110 for each drawing entity. An example of a sub-block 110 for a drawing entity 'X' is shown in FIG. 2. Sub-block 110 consists of computer statement templates 112 to create run-time variable input statements in the child program 160, computer statement templates 115 to create assignment statements in the child program 160, and computer statement templates 120 to create procedure invocation statements in the child program 160. The sub-block 110 also contains computer code 125 to combine the templates in statement blocks 112, 115, and 120 with the variable names and values which were previously input in forms 250 and 300 to create functional computer statements for output to the child program file 160. Finally, sub-block 110 also contains computer code 130 to output the functional computer statements created by computer statement block 125 to the child program file 160. A further understanding of the process is provided by a description of the sample code provided in Appendices B and C. Appendix B shows the sample computer code for creating a special variable as a constant value or as an equation as discussed previously with respect to FIG. 7. Appendix B also contains code for creating an input statement in the child program 160 so that the variable's value can be input at run-time as was described previously with respect to FIG. 7. Referring now to Appendix B, the computer statement template 115 for creating an assignment statement in the child program 160 is shown on statement line 4. The assignment statement template has the format "^^^^^=^^^^^" where ^ represents blank spaces. A functional assignment statement is created in the child program 160 by inserting the variable containing the variable's name which was input in box 265 of form 250 on the left hand side of the equals sign and the variable value which was input in box 270 of form 250 on the right hand side of the equals sign. This insertion process is shown on statement line 4. The computer code for combining the variable name and the variable value with the equals sign constitutes the code combiner 125 in sub-block 110. Finally the "Print #1" statements at the beginning of statement line 4 are used to print the functional assignment statements to the child program 160; these print statements constitute the output code block 130 in sub-block 110. Thus functional assignment statements are outputted to block 172 in child program 160.

A similar approach is used to create the code for inputting a run-time variable. The input statement template 112 is simply the QBASIC (R) "INPUT^^^^^^" statement shown in statement line 7 where ^ denotes blank spaces. The variable name which was input in box 265 of form 250 is inserted into the blank spaces, starting from the second blank space, to create a functional input statement in the child program 160. The code to combine the "INPUT" statement with the variable's name constitutes the code combiner 125 in sub-block 110. Finally the "Print #1" statements at the beginning of statement line 7 to print the functional assignment statements to the child program 160, constitutes the output code block 130 in sub-block 110. Thus functional input statements are outputted to block 170 in child program 160.

Appendix C shows the computer code for creating a straight line using the x,y coordinate values of the starting and end-point of the line which were previously input in form 300. As described earlier, these values can be input either as constant values or as equations. Referring now to Appendix C, the computer statement template 115 for creating an assignment statement in the child program 160 is shown on statement lines 3 to 6. The assignment statement template has the format "^^^^^=^^^^^" where ^ represents blank spaces. A functional assignment statement is created in the child program 160 by inserting the variable containing the x or y coordinate variable's name which was input in box 310X, or 310Y or 320X or 320Y of form 300 on the left hand side of the equals sign and the corresponding variable value which was input in box 310A or 310B or 320A or 320B on the right hand side of the equals sign. This insertion process is shown in statement lines 3 to 6. As discussed earlier for form 300, the parent program automatically creates the variable names for the x and y coordinates of the starting and ending points of the straight line as "XI,YI" and "XJ,YJ" where "I" and "J" are index number and "J" equals "I+1". The computer code for combining the variable name and the variable value with the equals sign constitutes the code combiner 125 in sub-block 110. Finally the "Print #1" statements at the beginning of statement lines 3 to 6 constitutes the output code block 130 in sub-block 110. Thus functional assignment statements are written to the sub-block 172 in child program 160. Sub-block 172 assigns either constant values or the results of equations describing the relationships between the special variables and the coordinate variables to the current x or y coordinate represented by the variable which contains the variable name.

The variables which describe the properties for drawing entity "X", input above in block 140, are transferred to the CAD script command creation procedure for drawing entity "X" in sub-block 178 by means of the computer code in block 120. Block 120 contains a template of a procedure invocation statement to call the CAD script command creation procedure for drawing entity "X" in sub-block 178 (as described previously, this procedure was created by sub-block 185). Sub-block 178 generates the CAD script commands which were created in code sub-block 185. This can be more clearly illustrated by the sample code in Appendix C, statement line 7, which contains a template for invoking the procedure "line00" which was created as described previously in Appendix A. The variables, representing the x,y coordinates of the starting point and the ending point of the straight line, are inserted into the procedure template by code in block 125 to create a functional procedure invocation statement, which invokes the procedure "line00", in the child program 160. Finally, the functional procedure invocation statement is printed out to block 174 in child program 160 by output code block 130. In Appendix C, code block 130 is the "Print #1" statement at the beginning of statement line 7 which prints the functional procedure invocation statement for invoking the procedure "line00" to the child program 160.

Thus, in the course of the above operations for creating a CAD script command for a straight line, line coordinates are input as constant values or as mathematical relationships into form 300, are converted into working code (which is output to the child program 160) by code block 105, and are finally converted to CAD script commands by code block 180. This procedure of converting entity properties to CAD script commands can be used for all other drawing entities like arcs, circles, text, dimensions, etc. The sub-code block 110 does not need to have all three statements 112, 115, and 120. For example, to define the special variable, the invocation statements 120 are not required, whereas to define the straight line the input statements 112 are not required.

Finally, the parent program has a selection block 135 to select the various drawing entities that are present on the drawing. An example of a selection block is shown in FIG. 9 which shows form 400. The form 400 has option radio-buttons 405 for selecting an arc, circle, line, double line, polyline, rectangle, create variable, create block, insert block or minsert (multiple insert) block. These drawing entity options are only representative of the many CAD drawing entities that could be created. Any of these options can be selected on an one-by-one basis. The selection of a entity opens the input form, for example form 250 or form 300, for that entity. If form 300 is selected, the variables names and values are then input in input boxes 310X, 310Y, 310A, 310B, 320X, 320Y, 320A, and 320B and the command button 330 is activated. As previously described, the parent program 100 uses the code in sub-block 110 in FIG. 2 to combine the variable names and values with computer language templates to generate code describing the entity. Sub-block 110 then outputs this generated code to the child program 160 The parent program 100 then returns the user back to the main selection form 400 for selection of another drawing entity. When the user is done selecting entities to define the drawing, he/she activates command button 410 which completes the compilation of the child program 160 by adding the drawing entity procedures, for example "line00", to the child program file 160 as described above for block 180. The procedures are appended to the computer statements which define the drawing entities which were previously output to the child program file 160 during execution of forms 400, 250, and 300. This completes the creation of the child program 160 which contains the run-time services block 165, the run-time variables input block 170, the assignment block 172, the procedure invocation block 174, and procedures block 176. Procedures block 176 contains the procedures sub-block 178 for each drawing entity "X". The child program 160 is now ready for use. The entire process of creating and using the child program 160 and the resultant CAD script file 70 is shown in FIG. 1 which will be discussed later.

Figure 3:
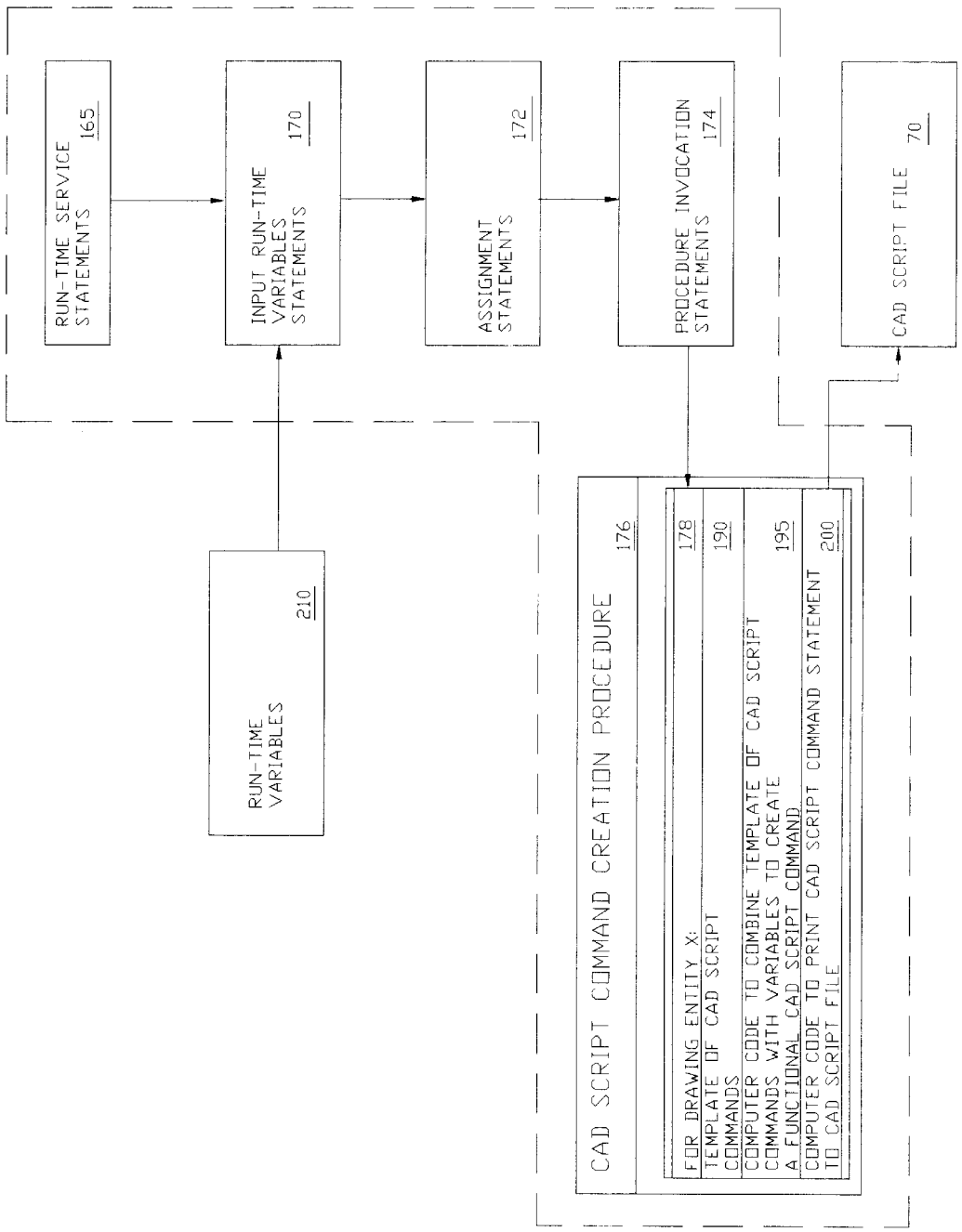
FIG. 3 is an overview of the child program.

The operation of the child program 160 is shown in FIG. 3. When the child program 160 is run, the run-time service statements 165 declare the procedures, for example "line00" which was discussed above, to be used in the child program 160 and allocate memory for the variables used in the child program 160. The run-time service statements 165 also open the CAD script command file 70 for to accept input of the generated CAD script commands. The input statements 170 for inputting the run-time variables 210, as described above, are then executed. The user inputs the requested values for the run-time variables 210. The child program then executes the assignment statements in sub-block 172, also described above, to calculate the value of the coordinates and other properties like diameters, lengths, etc. which are associated with the drawing entities on the drawing. Finally, the child program invokes the procedure for converting the computed x,y coordinates of the drawing entity into CAD script commands by executing the invocation statements in 174. Thus if a line is to be drawn, the invocation statement 174 will invoke the procedure "line00" whose creation was described previously and which is resident in the procedure block 176 as a sub-block 178. As described above, sub-block 178 contains CAD script template statements 190, combiner code 195, and script output code 200 for the drawing entity "X". The result of the execution of these statement is the CAD script command for drawing the drawing entity "X". This script command is then outputted to the CAD script file 70 which can then be processed by the relevant CAD program. The above procedure is repeated until all the drawing entities selected during the execution of forms 400, 250, and 300 are converted from their variable forms to CAD script commands. Thus the CAD script file 70 will contain a sequence of CAD command statements which describe all the drawing entities which make up the drawing for the specific embodiment of the application whose drawing is required. These CAD script commands will have the custom values of the variables which define a specific embodiment of the application. Thus a customized drawing showing the specific embodiment can be automatically created by processing the CAD script file 70 through the CAD program 60.

The operation of the entire code-generation system is shown in FIG. 1 which describes the interactions between the computer operator 10 and the computer environment 14. In the first step represented by block 500 within the Computer Environment 14 of FIG. 1, the user starts parent program 100. The parent program 100 described herein is written in Visual BASIC but it could be written in any computer language. The details of the parent program 100 have already been described above. The parent program 100 presents the computer operator 10 with a menu, as described above for form 400, showing a selection of CAD entities to be selected. The computer operator 10 responds by inputting the requested data into the computer through the computer's key-board or other suitable input device. The requested data could also be supplied by another computer program such as a spreadsheet or a database. Depending on the selected entity, the Code Generation program or parent program 100 writes computer language statements into a computer file to create the child computer program 160. This child program 160 is capable of creating a customized Script command file 70 that can be processed by the CAD program 60. In this case, the child program is created as a text file using the QBASIC (R) language syntax but it could be created in any computer-based format or computer language. Also, in this case, the script command file 70 is created using the AutoCAD(R) scripting language syntax, but the script file could be created in any computer language or format which is compatible with the CAD program being used.

In the second step, represented by block 510 of FIG. 1, the child program 160 is processed by a code compiler, for example the QBASIC(R) compiler. Optionally, the child program 160 can be integrated into the user's engineering program to create a combined engineering/drawing-automation program by merging the two programs within the code compiler environment. Thus the user is not only able to design his product but also automatically to create a drawing of that product. The result is a great increase in engineering and design and drafting productivity.

In the third step represented by block 520, the computer operator runs the child program 160 (which was created by running the parent program 100 in step 1) or the combined program created in block 510. FIG. 1 shows the child program 160 to be running from within the code compiler environment 80; however, as will be described shortly, it can also be run as an executable file from the operating system 92. The child program 160 prompts the user for values of run-time variables 210 that would define the drawing entity to be drawn in Step 3. The output of the child program 160 is a CAD script file 70 which contains the script language commands defining the drawing entities which make up the drawing of the application.

In the fourth step represented by block 530, the computer operator 10 runs the CAD program 60. If AutoCAD (R) is being used, the computer operator 10 can use the "Run Script File" command to process the script language commands contained in the script file 70 described above to automatically generate the drawing. If any other CAD package is being used, the computer operator 10 should use the appropriate commands to process the script language commands in the script file 70 through the CAD program 60. The computer user 10 can then modify or edit the generated drawing as needed using normal CAD operating procedures and commands.

Further processing of the child program 160 will be apparent to a computer programmer having an ordinary skill in the art. For example, FIG. 4 shows that the child program 160 could be processed further in a code compiler 80 to produce an object file 64 or an executable file 62 (child.exe) in addition to a CAD script file 70. FIG. 5. shows that the child program 160 could be merged with an user's application file 82 to create a combined file 84 within the code compiler environment 80. For example, if the user designs scrubbers, he/she can combine his/her process engineering program for sizing the scrubber with the child program 160 to create a combined engineering/drawing-automation program 84. This program can then be run from within the code compiler 80 to produce the CAD script file 70. Alternately, it can be converted to an object file 86 (combined.obj). The object file can then be converted to a library file for storage in the compiler's library from where it can be invoked by other computer programs. Alternately, an executable program 90 (combined.exe) of the combined program can be created, which can be run directly from within the operating system.

Figure 6A:
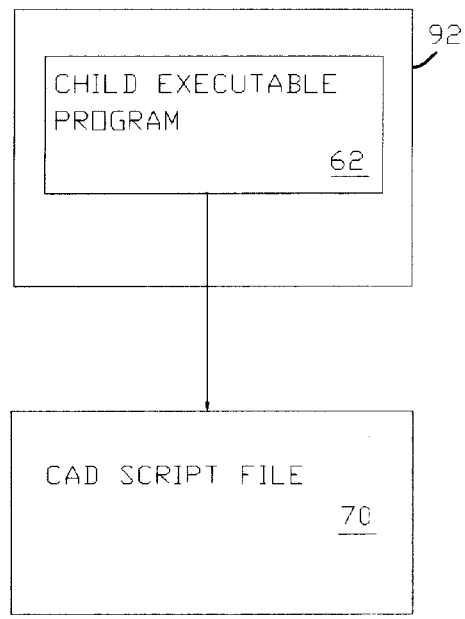
FIG. 6A is a third alternate overview of the child program during run-time.
Figure 6B:
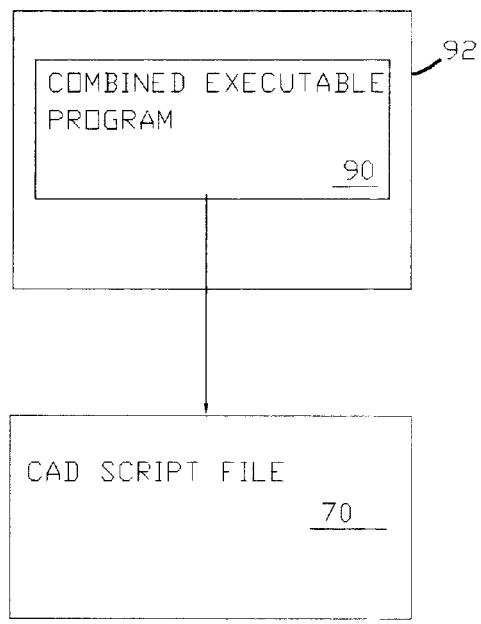
FIG. 6B is a fourth alternate overview of the child program during run-time.

As shown in FIG. 6A, the executable file (child.exe) file 62 created by code compiler 80 can be run directly from the DOS operating system 92 to create the CAD script file 70. Similarly, as shown in FIG. 6B, the executable file (combined.exe) 90 created by code compiler 80 can also be run directly from the DOS operating system 92 for creating the CAD script file 70. Alternately, the skilled computer programmer can directly alter the generated child program 160 to incorporate other modifications and enhancements as needed. The generated child program 160 can be treated just like any other computer program for these purposes. The child program 160 can also be merged with other child programs created by the same or other computer users. Thus a comprehensive computer program for automating the drawing process can be created over time by persons who do not have much computer programming skills. All of these methods of compiling and using a computer language file will be readily apparent to one having ordinary skill in the art.

SUMMARY, RAMIFICATIONS, AND SCOPE

Accordingly, the reader will see that the code-generation program of this invention can be used to easily create computer code for the automatic production of drawings using a Computer Aided Design (CAD) system by persons having a very low level of computer programming skills. The user can use the present invention along with their knowledge of basic co-ordinate geometry to automatically create computer language code to describe the drawing entities. The user does not need to possess expert computer programming skills to convert their knowledge of basic co-ordinate geometry into computer code which represents the drawing entity. The present invention will create the computer code for them by utilizing the coordinate geometrical description of the drawing as an input from the user. The present invention will create a customized child program which defines the drawing in mathematical terms. The user can then run the child program to produce CAD script commands which specifically and uniquely describe the drawing. The user can then process the script in the CAD program to automatically generate a customized drawing which describes their application. Thus the present invention eliminates the requirement for an expert programmer to create computer code to automatically generate drawings and puts these skills within the capability of the ordinary CAD user who possesses very little programming skills.

It should be noted that the above examples of the process of creating the child program 160 are shown for the purposes of illustrating the techniques only. One of ordinary skill in the art could easily extend the drawing entities to include other drawing entities that can be invoked by a CAD script command. Similarly, he/she could easily enhance the usability of the parent program 100 and versatility of the child program 160 by adding other features. For example, computer code templates for creating conditional statements to allow the child program 160 to undertake different courses of action based upon the values of pre-defined criteria could be added to the parent program 100. Similarly, computer code templates for creating iterative statements to allow the child program 160 to easily replicate drawing entities in arrays could also be added in the parent program. All of these techniques of enhancing the usability of the parent program 100 and creating a more versatile child program 160 can be easily practiced using the above-described process.

While the above description shows the inputs to be made from a computer keyboard, other forms of inputting the data, can be practiced in the invention. For example, graphical input wherein the general form of the drawing entity is drawn on the screen can be used. Similarly, the data can be input by voice commands, touch-screens, light pens, computer lists, or other communication devices. The inputs could also come from other computer programs or computer data-base files. All such modifications and enhancements will be readily apparent to one having ordinary skill in the art.

Although the present invention and its advantages have been described in detail, it should be understood that various changes, substitutions, and alterations can be made herein without departing from the spirit and scope of the invention as defined by the appended claims.

APPENDIX A

Print #1, "SUB line00 (xa, xb, xc, xd)"
Print #1, "n=2"
Print #1, "DIM x(n) AS SINGLE"
Print #1, "DIM y(n) AS SINGLE"
Print #1, "DIM b(n) AS STRING"
Print #1, "x(1)=xa"
Print #1, "y(1)=xb"
Print #1, "x(2)=xc"
Print #1, "y(2)=xd"
Print #1, "cc$="+Chr$(34)+"line"+Chr$(34)
Print #1, "FOR I=1TO n"
Print #1, "cc$=cc$+LTRIM$(RTRIM$(STR$(x(I))))+"+Chr$(34)+","+Chr$(34)+"+LTRIM$(RTRIM$(STR$(y(I))))"
Print #1, "IF I=n THEN"
Print #1, "cc$=cc$+CHR$(10)"
Print #1, "ELSE"
Print #1, "cc$=cc$+"+Chr$(34)+" "+Chr$(34)
Print #1, "END IF"
Print #1, "NEXT I"
Print #1, "PRINT cc$"
Print #1, "PRINT #1, cc$"
Print #1, "END SUB"

APPENDIX B

Sub DefineVariable (VarName$, VarValue As String)
Print #1, "Rem The following commands define a variable to be used in a formula"
If VarValue <>" "Then
  Print #1, VarName$; "="; VarValue
Else
  Print #1, "Print"+Chr$(34)+"Input"+Chr$(34)+Chr$(34)+VarName$+Chr$(34)+Chr$(10)
  Print #1, "INPUT"+VarName$
End If
End Sub

APPENDIX C

Sub PutLine (xi1$, yi1$, xval1$, yval1$, xi$, yi$, xval$, yval$)
Print #1, "Rem The following commands draw a line"
Print #1, xi1$; "="; LTrim$(RTrim$(xval 1$))
Print #1, yi1$; "="; LTrim$(RTrim$(yval 1$))
Print #1, xi$; "="; LTrim$(RTrim$(xval$))
Print #1, yi$; "="; LTrim$(RTrim$(yval$))
Print #1, "line00"; xi1$; ","; yi1$; ","; xi$; ","; yi$
End Sub

I claim:

1. A computer system for generating computer code for creating a CAD script command file from the input of geometric data which defines a drawing entity, that comprises:
   a computer code means for accepting said geometric data which defines said drawing entity; and
   a code generator means for outputting said generated computer code to a computer storage medium, said code generator means comprising:
      a computer code means consisting of at least one pre-defined code template to create at least one CAD script which defines said drawing entity;
      a computer code means to combine said accepted geometric data with said at least one pre-defined code template to create functional code for the creation of said at least one CAD script command;
      a computer code means for outputting said at least one CAD script command created by said functional code to said computer storage medium for use by a CAD program for the automatic drawing of said drawing entity; and
      a computer code means to output said created functional code and said code means for outputting said CAD script commands to said computer storage medium to create said generated computer code.

2. The computer system of claim 1, wherein said CAD script command is outputted as a computer text file.

3. The computer system of claim 2, wherein said CAD script command is formatted as AutoCAD® script command.

4. The computer system of claim 1, wherein said CAD script command is outputted as a computer binary file.

5. The computer system of claim 1, wherein said code generator means outputs said generated computer code as a computer text file.

6. The computer system of claim 1, wherein said code generator means outputs said generated computer code as a computer binary file.

7. The computer system of claim 1, wherein said computer code means for accepting said geometric data includes code to accept said geometric data of said at least one drawing entity as at least one mathematical equation.

8. The computer system of claim 1, wherein said computer code means for accepting said geometric data includes code to accept said geometric data of said at least one drawing entity as at least one graphical image.

9. The computer system of claim 1, wherein said computer code means for accepting said geometric data includes code to accept said geometric data of said at least one drawing entity from another computer software source.

10. The computer system of claim 1, wherein said computer code means for accepting said geometric data includes code to accept said geometric data of said at least one drawing entity from pre-defined properties of a pre-defined list of drawing entities.

11. The computer system of claim 1, wherein said code generator means further comprises:

a computer code means for inputting values of said geometric data of said at least one drawing entity as run-time variables; and a computer code means to output said computer code means for inputting values of said geometric data as run-time variables to said computer storage medium.

12. A method for generating computer code for creating a CAD script file from a first computer program, said first computer program having code elements for accepting geometric data of a drawing entity, code elements defining code templates for the creation of functional codes statements for the creation of CAD script commands, code elements for combining said geometric data with said predefined code templates to create said functional code statements, code elements for outputting said functional code statements to a computer storage medium, and code elements for outputting CAD script commands created by said functional code statements to said computer storage medium, said method comprising the steps of:

providing said geometric data of said drawing entity to said code elements for accepting geometric data of said drawing entity;

combining said accepted geometric data of said drawing entity with said predetermined code templates to create functional code for the creation of CAD script which defines said drawing entity;

outputting said created functional code to said computer storage medium; and outputting said code elements for outputting said created CAD script commands to said computer storage medium to produce said generated computer code.

13. The method of claim 12, wherein said CAD script commands are outputted as a computer text file.

14. The method of claim 13, wherein said CAD script commands are formatted as AutoCAD® script commands.

15. The method of claim 12, wherein said CAD script commands are outputted as a computer binary file.

16. The method of claim 12, wherein said outputted computer code is outputted as a computer text file.

17. The method of claim 12, wherein said outputted computer code is outputted as a computer binary file.

18. The method of claim 12, wherein said code elements for accepting said geometric data includes code to accept said geometric data of said at least one drawing entity as at least one mathematical equation.

19. The method of claim 12, wherein said code elements for accepting said geometric data includes code to accept said geometric data of said at least one drawing entity as at least one graphical image.

20. The method of claim 12, wherein said code elements for accepting said geometric data includes code to accept said geometric data of said at least one drawing entity from another computer software source.

21. The method of claim 12, wherein said code elements for accepting said geometric data includes code to accept said geometric data of said at least one drawing entity from pre-defined properties of a pre-defined list of drawing entities.

22. The method of claim 12, wherein said first computer program further includes a computer code means for inputting values of said geometric data of said at least one drawing entity as run-time variables and said method further comprises the step of outputting said computer code means for inputting values of said geometric data as run-time variables to said computer storage medium.

* * * * *